United States Patent
Koike

(10) Patent No.: US 7,846,253 B2
(45) Date of Patent: Dec. 7, 2010

(54) SILICON SEMICONDUCTOR SUBSTRATE AND PRODUCTION METHOD THEREOF

(75) Inventor: Yasuo Koike, Tokyo (JP)

(73) Assignee: Sumco Corporation, Tokyo (JP)

( * ) Notice: Subject to any disclaimer, the term of this patent is extended or adjusted under 35 U.S.C. 154(b) by 322 days.

(21) Appl. No.: 11/976,625

(22) Filed: Oct. 26, 2007

(65) Prior Publication Data

US 2008/0108207 A1    May 8, 2008

Related U.S. Application Data

(62) Division of application No. 11/583,856, filed on Oct. 20, 2006, now Pat. No. 7,582,357.

(30) Foreign Application Priority Data

Oct. 24, 2005  (JP) ............................. 2005-307971
Sep. 4, 2006   (JP) ............................. 2006-238774

(51) Int. Cl.
    *C30B 15/02* (2006.01)

(52) U.S. Cl. .............................. 117/13; 117/18; 117/21; 117/22; 117/935

(58) Field of Classification Search .................... 117/13, 117/18, 21, 22, 935
See application file for complete search history.

(56) References Cited

U.S. PATENT DOCUMENTS

| | | | |
|---|---|---|---|
| 6,077,343 A * | 6/2000 | Iida et al. ........................ | 117/2 |
| 6,197,109 B1 * | 3/2001 | Iida et al. ........................ | 117/19 |
| 6,277,501 B1 * | 8/2001 | Fujikawa ........................ | 428/641 |
| 2002/0142170 A1 | 10/2002 | Asayama et al. | |
| 2003/0008435 A1 | 1/2003 | Falster et al. | |
| 2004/0089225 A1 * | 5/2004 | Ono et al. ........................ | 117/19 |
| 2004/0166684 A1 | 8/2004 | Koike | |
| 2006/0266278 A1 | 11/2006 | Ono et al. | |
| 2007/0266930 A1 * | 11/2007 | Hoshi et al. ..................... | 117/20 |

FOREIGN PATENT DOCUMENTS

| JP | 2003-073191 | 3/2003 |
|---|---|---|
| JP | 2004-165489 | 6/2004 |

* cited by examiner

*Primary Examiner*—Robert M Kunemund
(74) *Attorney, Agent, or Firm*—Clark & Brody

(57) ABSTRACT

The present invention can provide a silicon semiconductor substrate used for and epitaxial wafer, in which uniform and high-level gettering ability is obtained irrespective of slicing positions from a silicon single crystal while generation of epitaxial defects can be suppressed, by doping carbon or carbon along with nitrogen during a pulling process of a CZ method or by performing appropriate heat treatment prior to the epitaxial process. Therefore, a crystal production yield can remarkably be improved because a permissible upper limit (concentration margin) of an oxygen concentration which is restricted by formation of a ring-shaped OSF region can be higher and also an excellent gettering ability is exhibited, while allowing an epitaxial wafer to be produced wherein epitaxial defects attributable to substrate crystal defects are not formed.

10 Claims, 2 Drawing Sheets

SILICON SEMICONDUCTOR SUBSTRATE AND PRODUCTION METHOD THEREOF

This is a divisional of U.S. patent application Ser. No. 11/583,856 filed Oct. 20, 2006 now U.S. Pat. No. 7,582,357.

FIELD OF THE INVENTION

The present invention relates to a silicon semiconductor substrate used for an epitaxial wafer (p/p$^+$ epitaxial wafer) in which boron is doped in high concentration and a production method thereof, and more particularly, to the silicon semiconductor substrate and production method thereof, in which a defect (hereinafter referred to as "epitaxial defect") attributable to a substrate crystal defect is not generated in an epitaxial layer while formation of oxygen precipitates (BMD: a bulk micro defect) is promoted by doping carbon or carbon along with nitrogen in a pulling process of the Czochralski method (hereinafter referred to as "CZ method").

DESCRIPTION OF THE RELATED ART

The scale of integration is rapidly increased in a silicon semiconductor integrated circuit device. With the development of a finer circuit to be formed, crystal defects such as dislocation—causing an increase in leak current and shortening of carrier lifetime—and metal impurities except for a dopant need to be much more strictly controlled than ever before in a device active region of a silicon wafer. Therefore, an epitaxial wafer in which the silicon epitaxial layer containing almost no crystal defects is grown has been developed and frequently used for a highly integrated device in order to respond to the demand for such strict control.

However, when the semiconductor-device integrated circuit is operated, a generated floating charge activates an unintended parasitic transistor, which results in creation of a phenomenon called latch-up. When the latch-up phenomenon occurs, the semiconductor device is not normally operated to cause such a trouble that the power is necessarily turned off for restitution in integrum.

A p/p$^+$ epitaxial wafer is applied as a countermeasure against the latch-up. The p/p+ epitaxial wafer is one in which the epitaxial layer is grown on a substrate (p$^+$ substrate) containing high-concentration boron by utilizing that the p$^+$ substrate has a gettering effect. In addition to the prevention of the latch-up phenomenon, the p$^+$ substrate also prevents a depletion layer expansion, the expansion being caused by voltage application to the surroundings of a trench when a capacitor having a trench structure is used. Therefore, the p$^+$ substrate is widely used because the p$^+$ substrate can achieve improvement of device functions.

FIG. 1 shows a distribution state of typical defects existing in a silicon single crystal produced by the CZ method. FIG. 1 schematically shows a observation result, in which a wafer having a surface perpendicular to a pulling axis is sliced from a single crystal immediately after the growth, Cu is caused to adhere to the surface by dipping the wafer in a copper nitrate solution, and a distribution of micro defects is observed after heat treatment by X-ray topography.

Because the silicon single crystal grown by the CZ method contains oxygen, sometimes a ring-shaped region of oxygen induced stacking fault (hereinafter referred to as "OSF") is generated by performing thermal oxidation treatment to the wafer sliced therefrom. The defects including a vacancy called crystal originated particle (COP) having a size ranging from about 0.1 μm to about 0.2 μm and a micro dislocation called dislocation cluster having a size of about 10 μm emerge as grown-in defects in the silicon single crystal grown by the CZ method.

For example, the defects are observed with the distribution state shown in FIG. 1 when the silicon single crystal is produced by the normal CZ pulling method. Referring to FIG. 1, a ring-shaped OSF region emerges at a position of about two-third of a crystal diameter, about $10^5$ to $10^6$ count/cm$^3$ COPs are detected inside the ring-shaped OSF region, and about $10^3$ to $10^4$ count/cm$^3$ dislocation cluster defects are detected outside the ring-shaped OSF region.

FIG. 2 is a sectional view schematically showing a defect distribution state of the single crystal which is grown while a pulling speed is gradually decreased in pulling the single crystal, and FIG. 2 also shows a general relationship between the pulling speed and the position where the crystal defects are generated. Usually the pulling speed during the single crystal growth and a temperature distribution in the single crystal immediately after solidification have a large influence on the defect generation state. For example, the defect distribution state shown in FIG. 2 can be obtained, when the single crystal which is grown while the pulling speed is gradually decreased is sectioned along a pulling axis of the crystal center to observe the defect distribution of the sectional surface by the technique similar to FIG. 1.

When viewed from the surface perpendicular to the pulling axis, in an early stage at which the pulling speed of a straight body portion is fast after a shoulder portion is formed and the single crystal comes to be a preset diameter, the ring-shaped OSF region exists in a crystal peripheral portion and many COPs are generated at the inside of the crystal. As the pulling speed is decreased, the diameter of the ring-shaped OSF region is gradually decreased while a region where the dislocation cluster defects are generated happens to emerge outside the ring-shaped OSF region, and then the dislocation cluster defect generation region occupies the whole surface.

FIG. 1 shows the wafer sliced from the single crystal which is grown at a position A of FIG. 2 or at the pulling speed corresponding to the position A. In the defect distribution shown in FIG. 2, the ring-shaped OSF region exists in the crystal surface over the whole length from a top portion to a tail portion of the single crystal in the wafer sliced from the single crystal which is grown at positions B and C of FIG. 2 or at the pulling speed corresponding to the positions B and C.

Generally the micro defects such as the dislocation are easily generated in the ring-shaped OSF region formed in the silicon single crystal containing high-concentration boron. When the epitaxial layer is grown on the wafer containing the ring-shaped OSF region formed in the silicon single crystal containing high-concentration boron, the crystal defects in the wafer propagate to the epitaxial layer to generate the epitaxial defects at the position corresponding to the ring-shaped OSF region during the growth process of the epitaxial layer. The presence of the epitaxial defects in the epitaxial layer which is of the device active region causes degradation of device characteristics, which leads to the decrease in device production yield.

In order to cope with the above problems, Japanese Patent Application Publication No. 2004-165489 proposes a method, in which the silicon single crystal containing the high-concentration boron is grown on various pulling speed conditions, the pulling speed at which the ring-shaped OSF region is eliminated in a crystal center portion is determined from the study result of the single crystal defect distribution to obtain the silicon single crystal having the crystal region where the ring-shaped OSF region is eliminated in the crystal center portion, and thereby the epitaxial layer is grown on the wafer in which the ring-shaped OSF region is eliminated in the crystal center portion.

However, in the method proposed in Japanese Patent Application Publication No. 2004-165489, when the pulling condition on which the ring-shaped OSF region is eliminated in the crystal center portion over the whole length of the single crystal, there is a restraint from the standpoint of production efficiency because the pulling speed becomes extremely slow. Therefore, it is not desirable to apply the method proposed in Japanese Patent Application Publication No. 2004-165489 to the method for producing the silicon semiconductor substrate which becomes the epitaxial wafer substrate.

Japanese Patent Application Publication No. 2003-73191 also proposes a method in which, because micro dislocations are generated in the ring-shaped OSF region of the wafer doped with nitrogen and high-concentration boron although the ring-shaped OSF region is not an I-rich region, the silicon single crystal for the epitaxial growth is produced on the condition that V/G (V: pulling speed and G: temperature gradient in an crystal axis direction near a solid-liquid interface in the crystal) located between a lower limit value of the micro dislocation generation region in the ring-shaped OSF region and an upper limit value of the I-rich region.

However, in the method proposed in Japanese Patent Application Publication No. 2003-73191, when the ring-shaped OSF region emerges in the crystal surface over the whole length of the pulled single crystal, any consideration is not given to nitrogen and boron segregation generated from the top portion toward the tail portion of the silicon single crystal, and thus it is difficult that the gettering ability is uniformly obtained while the epitaxial defects are decreased over the whole single crystal.

SUMMARY OF THE INVENTION

In the growth of the silicon single crystal containing the high-concentration boron by the CZ method, when the growth is performed on the condition that the ring-shaped OSF region emerges in the crystal surface over the whole length of the pulled single crystal, the boron concentration is increased over the whole length of the single crystal, particularly in the tail portion due to the boron segregation, and the epitaxial defects are generated, in association with an influence of a thermal history, in the ring-shaped OSF region during the epitaxial growth process.

And in the case where the silicon single crystal contains nitrogen, because a BMD density largely depends on the slicing positions from the silicon single crystal due to the nitrogen segregation in the growth by the CZ method, the uniform gettering ability is hardly obtained over the whole length of the single crystal, and the epitaxial defect generation state is also changed in the epitaxial wafer according to the slicing position from the silicon single crystal.

Then, in producing the epitaxial wafer, because of high temperatures ranging from 1050° C. to 1200° C. during an epitaxial layer growth process, BMDs which should become a nucleus of the micro defects in the substrate are reduced and eliminated, and the sufficient number of micro defects which become gettering sources are hardly induced into the wafer in the subsequent device process. Particularly, when the device process is performed at lower temperatures, because a growth rate of BMD becomes slower, the sufficient gettering ability cannot be exhibited not only in the initial stage of the device process but over the whole device process.

In view of the foregoing problems regarding epitaxial wafer, the present invention is attempted, and its object is to provide a silicon semiconductor substrate and a production method thereof in which, in any epitaxial wafer substrate, the uniform and high-level gettering ability can be obtained irrespective of the slicing positions from the silicon single crystal while the generation of the epitaxial defects is suppressed, by doping carbon or carbon along with nitrogen during the pulling process of the CZ method and/or by performing the appropriate heat treatment prior to the epitaxial process.

In the case where the single crystal is grown on the condition that the ring-shaped OSF region emerges in the crystal surface over the whole length of the pulled single crystal, the formation of the ring-shaped OSF region can be suppressed when the carbon is doped during the pulling process.

Hence, such a carbon doping effect of suppressing the formation of the ring-shaped OSF region is incorporated over the whole length of the single crystal where the ring-shaped OSF region should emerge, which allows defect characteristics to be moderated and used as a product even in the region where the defect characteristics of the ring-shaped OSF region should become conspicuous due to the boron segregation or the influence of the thermal history in the tail portion of the single crystal.

And, in the case where the nitrogen is doped, the nitrogen is segregated from the top portion toward the tail portion of the grown single crystal, the nitrogen concentration varies over the whole length of the single crystal, and thereby the gettering ability fluctuates to easily generate the epitaxial defects in the tail portion. Even in this case, the fluctuations can be moderated to exhibit the uniform gettering ability over the whole length. The present invention can be completed based on the findings and expertise of the carbon doping.

Thus, a silicon semiconductor substrate according to the present invention, is characterized in that, so as to be better fitted to an epitaxial wafer substrate, the silicon semiconductor substrate is grown by the Czochralski method on a condition that a ring-shaped oxygen induced stacking fault region emerges in a crystal surface over a whole length of a straight body portion of a pulled silicon single crystal, and the silicon semiconductor substrate is sliced from the silicon single crystal in which boron ranging from $1 \times 10^{17}$ to $1 \times 10^{19}$ atoms/cm$^3$ and carbon ranging from $1 \times 10^{15}$ to $2 \times 10^{16}$ atoms/cm$^3$ (ASTM F123-1981) are doped.

Further, a silicon semiconductor substrate according to the present invention is characterized in that the silicon semiconductor substrate is grown by the Czochralski method on a condition that a ring-shaped oxygen induced stacking fault region emerges in a crystal surface over a whole length of a straight body portion of a pulled silicon single crystal, and the silicon semiconductor substrate is sliced from the silicon single crystal in which boron ranging from $1 \times 10^{17}$ to $1 \times 10^{19}$ atoms/cm$^3$, carbon ranging from $1 \times 10^{15}$ to $2 \times 10^{16}$ atoms/cm$^3$ (ASTM F123-1981), and nitrogen ranging from $5 \times 10^{12}$ to $5 \times 10^{14}$ atoms/cm$^3$ are doped.

Thus, the fluctuation of characteristics over the whole length of the single crystal associated with the boron segregation and the nitrogen segregation is alleviated by doping the carbon in the silicon semiconductor substrate of the present invention, so that the uniform and high-level gettering ability can be obtained irrespective of the slicing positions from the silicon single crystal while the generation of the epitaxial defects is suppressed.

In the silicon semiconductor substrate by the present invention, the silicon semiconductor substrate may be sliced from the silicon single crystal which is grown while an oxygen concentration ranges from $9 \times 10^{17}$ to $16 \times 10^{17}$ atoms/cm$^3$ (ASTM F121-1979). The formation of the ring-shaped OSF region emerging in the crystal can be suppressed by doping carbon during the pulling process. Therefore, the permissible upper limit (concentration margin) of the oxygen concentration which is restricted by the appearance of the OSF nuclei can be much higher, and the device characteristics are not degraded even in the intermediate oxygen concentration level or high oxygen concentration level.

In the silicon semiconductor substrate by the present invention, a density of oxygen precipitates (BMD) in a cross section of a silicon substrate sliced from the silicon single crystal can be not lower than $1\times10^4$ count/cm$^2$ in any position over the whole length of the straight body portion of the single crystal, whereby the uniform and high-level gettering ability can be secured.

A silicon semiconductor substrate according to the present invention is characterized in that an epitaxial defect attributable to a crystal defect of the silicon semiconductor substrate does not exist on a surface of an epitaxial layer in any position over the whole length of the straight body portion of the pulled single crystal when the epitaxial layer is formed on the silicon semiconductor substrate. The generation of the epitaxial defect can be suppressed even in the tail portion of the single crystal by applying the carbon doping effect of suppressing the formation of the ring-shaped OSF region over the whole length of the single crystal.

A method for producing a silicon semiconductor substrate according to the present invention is characterized in that so as to be better fitted to an epitaxial wafer, the silicon semiconductor substrate is sliced from a silicon single crystal, the silicon single crystal being grown while boron ranging from $1\times10^{17}$ to $1\times10^{19}$ atoms/cm$^3$ and carbon ranging from $1\times10^{15}$ to $2\times10^{16}$ atoms/cm$^3$ (ASTM F123-1981) are doped on a condition that a ring-shaped oxygen induced stacking fault region emerges in a crystal surface over a whole length of a straight body portion of a pulled silicon single crystal by the CZ method.

Further, a method for producing a silicon semiconductor substrate according to the present invention is characterized in that the silicon semiconductor substrate is sliced from a silicon single crystal, the silicon single crystal being grown while boron ranging from $1\times10^{17}$ to $1\times10^{19}$ atoms/cm$^3$, carbon ranging from $1\times10^{15}$ to $2\times10^{16}$ atoms/cm$^3$, and nitrogen ranging from $5\times10^{12}$ to $5\times10^{14}$ atoms/cm$^3$ (ASTM F123-1981) are doped on a condition that a ring-shaped oxygen induced stacking fault region emerges in a crystal surface over a whole length of a straight body portion of a pulled silicon single crystal by the CZ method.

Thus, in the silicon semiconductor substrate production method by the present invention, the characteristics fluctuation over the whole length of the single crystal associated with the boron segregation and the nitrogen segregation is alleviated by doping the carbon during the pulling process, so that the uniform and high-level gettering ability can be obtained irrespective of slicing positioned from the silicon single crystal while the generation of the epitaxial defect is suppressed.

In the method for producing a silicon semiconductor substrate by the present invention, a heat treatment may be performed to the silicon substrate sliced from the silicon single crystal, at 700° C. to 900° C. for 15 minutes to 4 hours prior to an epitaxial process. Such a heat treatment can grow precipitation nuclei that might disappear by the high-temperature epitaxial growth process, which allows the nuclei to not disappear during subsequent epitaxial process and enables the density of retained precipitates to increase.

The method for producing a silicon semiconductor substrate by the present invention, can be characterized in that the silicon substrate is sliced from the silicon single crystal which is grown while an oxygen concentration ranges from $9\times10^{17}$ to $16\times10^{17}$ atoms/cm$^3$ (ASTM F121-1979). Therefore, the permissible upper limit (concentration margin) of the oxygen concentration which is restricted in association with the appearance of the OSF nuclei can be much higher by the carbon doping effect of suppressing the formation of the ring-shaped OSF region, and the device characteristics are not degraded even in the intermediate oxygen concentration level and high oxygen concentration level.

In the method for producing a silicon semiconductor substrate by the present invention, a density of oxygen precipitates in a cross section of a silicon substrate sliced from the silicon single crystal is not lower than $1\times10^4$ count/cm$^2$ in any slicing position over the whole length of the straight body portion of the single crystal. Therefore, the uniform and high-level gettering ability can be secured.

In the method for producing a silicon semiconductor substrate by the present invention, an epitaxial defect attributable to a crystal defect of the obtained silicon semiconductor substrate does not exist in a surface of an epitaxial layer in any slicing position over the whole length of the straight body portion of the single crystal when the epitaxial layer is formed on the silicon semiconductor substrate. The generation of the epitaxial defect can be suppressed even in the tail portion of the single crystal by incorporating the carbon doping effect of suppressing the formation of the ring-shaped OSF region over the whole length of the single crystal.

According to the silicon semiconductor substrate and the production method thereof by the present invention, in any epitaxial wafer substrate, the uniform and high-level gettering ability is obtained irrespective of the slicing positions from the silicon single crystal while the generation of the epitaxial defect can be suppressed, by doping carbon or carbon and nitrogen during the pulling process of the CZ method and/or by performing the appropriate heat treatment prior to the epitaxial process.

Therefore, the permissible upper limit (concentration margin) which is restricted by the formation of the ring-shaped OSF region can be much higher and the excellent gettering ability can be exhibited, while enabling to make the epitaxial wafer in which the epitaxial defect attributable to the substrate crystal defect might not be generated, thereby making it possible to remarkably improve the crystal production yield.

DETAILED DESCRIPTION OF THE PREFERRED EMBODIMENTS

Figure 1:
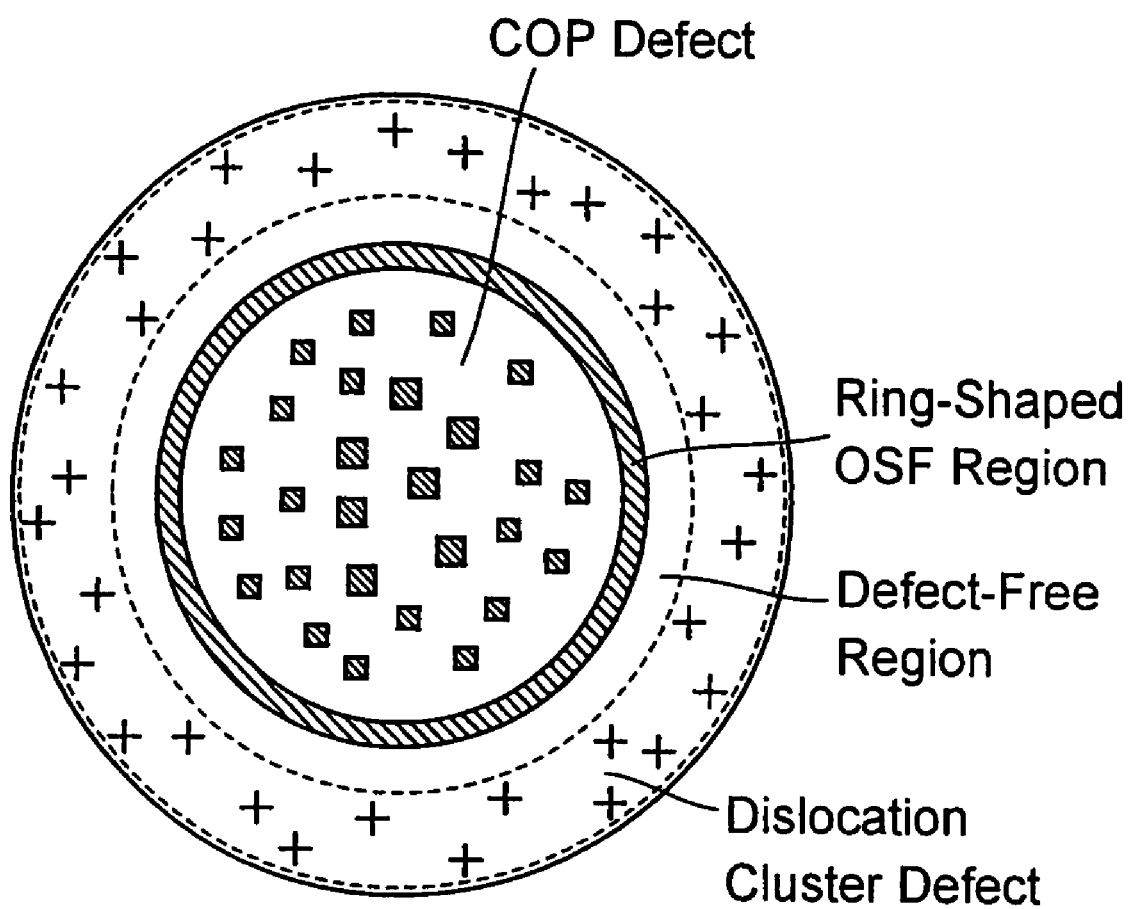
FIG. 1 shows a distribution state of typical defects existing in a silicon single crystal produced by a CZ method.
Figure 2:
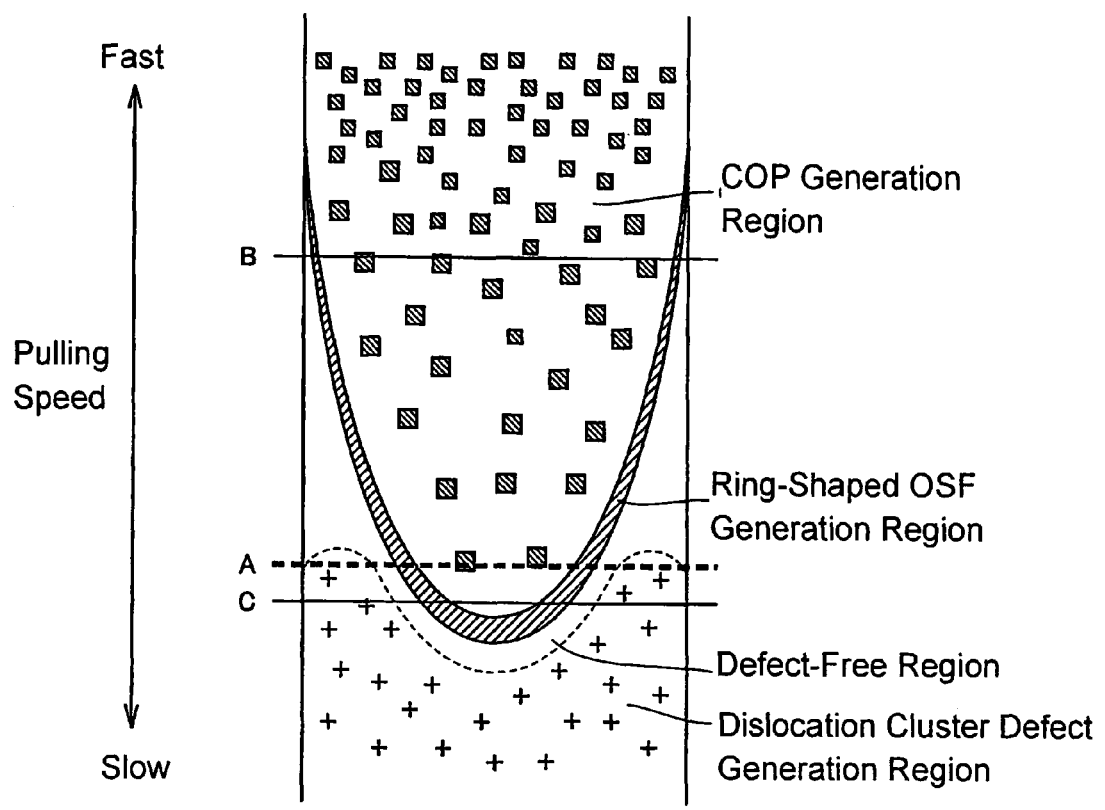
FIG. 2 is a sectional view schematically showing a defect distribution state of a single crystal which is grown while a pulling speed is gradually decreased in pulling the single crystal, and FIG. 2 also shows a general relationship between the pulling speed and a position where the crystal defect is generated.

A silicon semiconductor substrate according to the present invention contains boron in high concentration. Specifically the silicon semiconductor substrate by the present invention is grown while boron is doped in the range of $1\times10^{17}$ to $1\times10^{19}$ atoms/cm$^3$, and the silicon semiconductor substrate is used as the epitaxial wafer substrate. The reason why the boron concentration is not lower than $1\times10^{17}$ atoms/cm$^3$ is that the enhancement of boron concentration increases substrate strength while promoting oxygen precipitation to secure the gettering effect. On the other hand, when the boron concentration exceeds $1 \times 10^{19}$ atoms/cm$^3$, the ring-shaped OSF region emerging in the crystal surface contracts and disappear in the crystal center portion, and the ring-shaped OSF region is not generated in the crystal surface. However, the dislocation easily occurs in the single crystal ingot growth stage, and the stable single crystal is hardly grown, because the boron concentration of $1 \times 10^{19}$ atoms/cm$^3$ is a solubility limit of boron to the silicon crystal.

And in the silicon semiconductor substrate by the present invention, it is essential to add carbon in the pulling process by the CZ method in order to suppress the formation of the ring-shaped OSF region emerging in the crystal surface. Therefore, when the poly-crystalline silicon is melted before the pulling stage of the CZ method, pure carbon is added to adjust the carbon concentration contained in the post-pulling silicon single crystal.

The area where the ring-shaped OSF region is generated is the one in which the vacancy is dominant during the crystal growth, and a stable precipitate nucleus exists at high temperatures in the ring-shaped OSF region. When an oxidation treatment is performed in the ring-shaped OSF region, excessive interstitial silicon is injected into the crystal, and the interstitial silicon is concentrated on a strain field of oxygen precipitates (BMD) to induce the stacking fault. Because the lattice-substitution carbon has an atomic radius of 0.66 times as big as that of silicon, a volume is reduced and the carbon absorbs the interstitial silicon by forming a compound (SiC) of the carbon and interstitial silicon.

A degree of supersaturation of the interstitial silicon can be decreased to suppress the formation of the ring-shaped OSF region emerging the crystal surface by adding the carbon into the silicon single crystal based on the action that the carbon absorbs the interstitial silicon.

As described above, even the tail portion, namely, the region where the defect characteristics of the ring-shaped OSF region remarkably emerges due to the boron segregation caused by the doping of the high-concentration boron and the influence of the thermal history can be healed and allowed to be used as the product by incorporating the carbon doping effect of suppressing the formation of the ring-shaped OSF region over the whole length of the single crystal.

Similarly, even in the case where the nitrogen concentration is changed over the whole length of the single crystal due to the nitrogen segregation in doping the nitrogen, the generation of the epitaxial defect caused by propagation of the substrate crystal defect can be suppressed in the tail portion by alleviating the influence of the change in nitrogen concentration to achieve the uniform gettering ability.

When the carbon concentration is lower than $1 \times 10^{15}$ atoms/cm$^3$, the formation of the ring-shaped OSF region emerging in the crystal is not effectively suppressed. On the other hand, when the carbon concentration exceeds $2 \times 10^{16}$ atoms/cm$^3$, the carbon segregation tends to be generated in the crystal to have an influence on the substrate quality. Therefore, the carbon concentration doped in the silicon single crystal is set in the range of $1 \times 10^{15}$ to $2 \times 10^{16}$ atoms/cm$^3$ (ASTM F123-1981).

Further, in the silicon semiconductor substrate by the present invention, while oxygen precipitation is promoted, nitrogen can be doped to secure the sufficient substrate strength. The effect of promoting oxygen precipitation does not exhibit when the nitrogen concentration is lower than $5 \times 10^{12}$ atoms/cm$^3$, and when the nitrogen concentration exceeds $5 \times 10^{14}$ atoms/cm$^3$ to become excessive, the dislocation is easily generated to obstruct the growth of the single crystal. Therefore, the nitrogen concentration doped in the silicon single crystal is set in the range of $5 \times 10^{12}$ to $5 \times 10^{14}$ atoms/cm$^3$.

And, in the silicon semiconductor substrate by the present invention, the permissible amount of the oxygen concentration can be enhanced because the formation of the ring-shaped OSF region is suppressed by the carbon doping. However, when the oxygen concentration is lower than $9 \times 10^{17}$ atoms/cm$^3$, because the wafer strength cannot sufficiently be secured, a slip is easily generated and BMD density (oxygen precipitates) becomes insufficient. On the other hand, when the oxygen concentration exceeds $16 \times 10^{17}$ atoms/cm$^3$, the BMD generation and the OSF formation becomes apparent in a wafer surface portion to induce the epitaxial defect in the subsequent epitaxial layer formation, and consequently, the device characteristics likely becomes worsened. Therefore, the oxygen concentration is preferably set in the range of $9 \times 10^{17}$ to $16 \times 10^{17}$ atoms/cm$^3$ (ASTM F121-1979).

In the present invention, the condition that the ring-shaped OSF region emerges in the crystal surface over the whole length of the straight body portion of the pulled single crystal is defined such that: the ring-shaped OSF region emerging in the crystal surface can exist in the crystal surface over the whole length from the top portion to the tail portion of the straight body portion in the grown single crystal, while being neither reduced nor eliminated in the crystal center portion, when the single crystal is grown without doping the carbon by the CZ method.

Specifically, given that G (° C./mm) is the temperature gradient in the crystal axis direction in the temperature range from a melting point to 1370° C. and V (mm/min) is the pulling speed, the condition defined by the present invention is that the crystal is grown while a ratio of V/G is not lower than 0.2 mm/° C.·min.

To check whether or not the silicon semiconductor substrate by the present invention is sliced from the silicon single crystal grown on the condition that the ring-shaped OSF region emerges in the crystal surface, it is necessary to examine whether or not the ring-shaped OSF region exists within the crystal surface by performing high-temperature oxidation heat treatment and selective etching to the substrate sliced from the straight body portion of the pulled single crystal.

For said high-temperature oxidation heat treatment, a condition that the substrate is held at the heating temperature ranging from 1100° C. to 1150° C. for one to four hours in a dry O$_2$ gas or wet O$_2$ gas atmosphere, or alternatively a two-stage heat treatment condition such that the substrate is held at a heating temperature ranging from 1100° C. to 1150° C. for one to four hours in the dry O$_2$ gas or wet O$_2$ gas atmosphere after being held at the heating temperature ranging from 900° C. to 1000° C. for one to four hours in the dry O$_2$ gas or wet O$_2$ gas atmosphere, can be adopted.

In the silicon semiconductor substrate by the present invention, BMD density in the cross section of the silicon substrate sliced from the silicon single crystal is preferably not lower than $1 \times 10^4$/cm$^2$ in any position over the whole length of the pulled straight body portion. When the BMD density is not lower than $1 \times 10^4$/cm$^2$, the high-level gettering ability can uniformly be exhibited over the whole length because the gettering can sufficiently be performed to Ni which is of typical source for heavy-metal contamination.

Usually the heat treatment (pre-annealing) is effectively performed to the silicon substrate at the temperature of 700° C. to 900° C. to secure the BMD density of not lower than $1 \times 10^4$/cm$^2$ over the whole length of the pulled straight body portion. In the case where the silicon substrate has the high oxygen concentration, the equivalent BMD density can be secured even if the heat treatment (pre-annealing) is not performed.

In the silicon semiconductor substrate by the present invention, even if the ring-shaped OSF region emerges over the whole length of the grown single crystal, the crystal defect attributable to the ring-shaped OSF region of the substrate is eliminated in any region of the pulled single crystal by incorporating the carbon doping effect of suppressing the formation of the ring-shaped OSF region over the whole length of the single crystal, which eliminates the generation of the epitaxial defect attributable to the crystal defect.

In a production method of the present invention, the growth of the oxygen precipitate nuclei and/or BMD can be promoted by performing the heat treatment to the silicon substrate at the temperature of 700° C. to 900° C. prior to the epitaxial process. In other words, the oxygen precipitate nuclei or BMD which might be eliminated by the high-temperature epitaxial growth is grown by the heat treatment prior to said process, which allows retained BMD density to be increased without eliminating the oxygen precipitate nuclei and/or BMD in the subsequent epitaxial process.

When the heating temperature is lower than 700° C. in the pre-epitaxial process heat treatment, it takes a long time to sufficiently grow the oxygen precipitate nuclei. When the heating temperature exceeds 900° C., BMD having the relatively large size is excessively grown in the stage in which the single crystal is grown, which induces the defect in the epitaxial layer. In the high-temperature heat treatment more than 1100° C., the growth action of the oxygen precipitate nuclei does not occur while the number of eliminated oxygen precipitate nuclei is increased. Therefore, the heating temperature is set in the range of 700° C. to 900° C. in the present invention.

The oxygen precipitate nuclei cannot sufficiently be grown when the heating time is shorter than 15 minutes in the heat treatment at the temperature of 700° C. to 900° C. On the other hand, when the heating time is longer than four hours, BMD is protruded to the epitaxial layer to easily induce the defect of the epitaxial layer. Therefore, the heating time is set in the range of 15 minutes to 4 hours in the present invention.

Desirably the heat treatment is performed before a mirror-polishing process of the wafer, to which the epitaxial process is performed, such that a surface flaw generated in association with the heat treatment is not left behind, for example, the flaw caused by a wafer boat is not left behind in the surface of the wafer, the wafer boat being loaded with wafers to be heat-treated.

EXAMPLES

The excellent effect exhibited by the semiconductor silicon wafer by the present invention in which the high-concentration boron is doped along with the carbon will be described with reference to the following Example 1 and Example 2.

Example 1

The silicon single crystal whose straight body portion has a diameter of 300 mm was grown from a silicon raw material melt in which the high-concentration boron and carbon are doped by the CZ method, and the wafers were sliced from three sections composed of the top portion, the body portion (intermediate portion), and the tail portion of the single crystal to produce test samples. At this point, the oxygen concentration of the test sample was separated into a low-concentration level and a high-concentration level. The boron concentration, the carbon concentration, and the oxygen concentration which are contained in the test sample were measured by a secondary ion mass spectrometry (SIMS) method.

The obtained test samples were separated into one group to which the mirror polish finishing was applied to immediately perform the epitaxial growth process and the other group to which the epitaxial growth process is performed after the pre-epitaxial process heat treatment is performed, followed by the mirror-polish finishing. The heat treatment was set at two conditions A and B. The heat treatment condition A comprises: the test samples were loaded at 700° C.; the temperature was raised at a rate of 5° C./min to 900° C.; the test samples were heated at 900° C. for 30 minutes; the temperature was lowered to 700° C.; and then the test samples were taken out. The heat treatment condition B comprises: the test samples were loaded at 700° C.; the temperature was raised at the rate of 1° C./min to 900° C.; the test samples were heated at 900° C. for 30 minutes; the temperature was lowered to 700° C.; and then the test samples were taken out.

In the epitaxial process condition, the deposition temperature was set to 1150° C. and the epitaxial layer having a thickness of about 5 µm was grown on the substrate surface. The evaluation heat treatment was performed to the obtained epitaxial wafer at 1000° C. for 16 hours in an oxygen atmosphere. Then, the selective etching was performed to a wafer cross section for five minutes with a light etching solution, and the BMD density of the wafer cross section was measured with an optical microscope. The density of a light point defect (LPD) whose size was not lower than 0.09 µm was measured in the surface of the epitaxial layer with a planar defect detector (SP1; made by Tenchor). In order to check whether or not the EP planar defect (LPD) observed SP1 was the defect attributable to the substrate crystal defect, the defect was evaluated with a transmission electron microscope (TEM) based on a coordinate of LPD on the epitaxial layer, which was detected by SP1.

Tables 1 and 2 show the measurement results of the boron concentration, carbon concentration, oxygen concentration, BMD density, and epitaxial defect (EP defect) density along with the pre-epitaxial process heat treatment condition. Table 1 shows the case of the low oxygen concentration level and Table 2 shows the case of the high oxygen concentration level.

TABLE 1

| Test No. | Single crystal section | SIMS analytical result (atoms/cm³) | | | Heat treatment | Density measuring result | | Category |
| | | Boron | Carbon | Oxygen | | BMD (count/cm²) | EP defect (count/wf) | |
|---|---|---|---|---|---|---|---|---|
| 1L | Top portion | $3.0 \times 10^{18}$ | — | $1.4 \times 10^{18}$ | — | $<1 \times 10^4$ | <10 | Comparative Example (CE) |
| 2L | | $3.0 \times 10^{18}$ | — | $1.4 \times 10^{18}$ | A | $2 \times 10^5$ | <10 | CE |
| 3L | | $3.0 \times 10^{18}$ | — | $1.4 \times 10^{18}$ | B | $5 \times 10^5$ | <10 | CE |
| 4L | | $3.0 \times 10^{18}$ | $2.0 \times 10^{15}$ | $1.4 \times 10^{18}$ | — | $<1 \times 10^4$ | <10 | Inventive Example (IE) |
| 5L | | $3.0 \times 10^{18}$ | $2.0 \times 10^{15}$ | $1.4 \times 10^{18}$ | A | $4 \times 10^5$ | <10 | IE |
| 6L | | $3.0 \times 10^{18}$ | $2.0 \times 10^{15}$ | $1.4 \times 10^{18}$ | B | $1 \times 10^6$ | <10 | IE |
| 7L | Body | $5.0 \times 10^{18}$ | — | $1.2 \times 10^{18}$ | — | $<1 \times 10^4$ | <10 | CE |

TABLE 1-continued

| Test No. | Single crystal section | SIMS analytical result (atoms/cm$^3$) Boron | Carbon | Oxygen | Heat treatment | Density measuring result BMD (count/cm$^2$) | EP defect (count/wf) | Category |
|---|---|---|---|---|---|---|---|---|
| 8L | portion | $5.0 \times 10^{18}$ | — | $1.2 \times 10^{18}$ | A | $3 \times 10^5$ | <10 | CE |
| 9L | | $5.0 \times 10^{18}$ | — | $1.2 \times 10^{18}$ | B | $7 \times 10^5$ | <10 | CE |
| 10L | | $5.0 \times 10^{18}$ | $8.0 \times 10^{15}$ | $1.2 \times 10^{18}$ | — | $<1 \times 10^4$ | <10 | IE |
| 11L | | $5.0 \times 10^{18}$ | $8.0 \times 10^{15}$ | $1.2 \times 10^{18}$ | A | $1 \times 10^6$ | <10 | IE |
| 12L | | $5.0 \times 10^{18}$ | $8.0 \times 10^{15}$ | $1.2 \times 10^{18}$ | B | $3 \times 10^6$ | <10 | IE |
| 13L | Tail | $1.0 \times 10^{19}$ | — | $9.0 \times 10^{17}$ | — | $<1 \times 10^4$ | >50 | CE |
| 14L | portion | $1.0 \times 10^{19}$ | — | $9.0 \times 10^{17}$ | A | $3 \times 10^5$ | >100 | CE |
| 15L | | $1.0 \times 10^{19}$ | — | $9.0 \times 10^{17}$ | B | $5 \times 10^5$ | >100 | CE |
| 16L | | $1.0 \times 10^{19}$ | $3.0 \times 10^{16}$ | $9.0 \times 10^{17}$ | — | $3 \times 10^4$ | <10 | IE |
| 17L | | $1.0 \times 10^{19}$ | $3.0 \times 10^{16}$ | $9.0 \times 10^{17}$ | A | $1 \times 10^6$ | <10 | IE |
| 18L | | $1.0 \times 10^{19}$ | $3.0 \times 10^{16}$ | $9.0 \times 10^{17}$ | B | $2 \times 10^6$ | <10 | IE |

TABLE 2

| Test No. | Single crystal section | SIMS analytical result (atoms/cm$^3$) Boron | Carbon | Oxygen | Heat treatment | Density measuring result BMD (count/cm$^2$) | EP defect (count/wf) | Category |
|---|---|---|---|---|---|---|---|---|
| 1H | Top portion | $3.0 \times 10^{18}$ | — | $1.6 \times 10^{18}$ | — | $4 \times 10^4$ | <10 | Comparative Example (CE) |
| 2H | | $3.0 \times 10^{18}$ | — | $1.6 \times 10^{18}$ | A | $1 \times 10^6$ | >100 | CE |
| 3H | | $3.0 \times 10^{18}$ | — | $1.6 \times 10^{18}$ | B | $2 \times 10^6$ | >100 | CE |
| 4H | | $3.0 \times 10^{18}$ | $2.0 \times 10^{15}$ | $1.6 \times 10^{18}$ | — | $5 \times 10^4$ | >100 | Inventive Example (IE) |
| 5H | | $3.0 \times 10^{18}$ | $2.0 \times 10^{15}$ | $1.6 \times 10^{18}$ | A | $3 \times 10^6$ | <10 | IE |
| 6H | | $3.0 \times 10^{18}$ | $2.0 \times 10^{15}$ | $1.6 \times 10^{18}$ | B | $5 \times 10^6$ | <10 | IE |
| 7H | Body portion | $5.0 \times 10^{18}$ | — | $1.4 \times 10^{18}$ | — | $3 \times 10^4$ | >100 | CE |
| 8H | | $5.0 \times 10^{18}$ | — | $1.4 \times 10^{18}$ | A | $1 \times 10^6$ | >100 | CE |
| 9H | | $5.0 \times 10^{18}$ | — | $1.4 \times 10^{18}$ | B | $2 \times 10^6$ | >100 | CE |
| 10H | | $5.0 \times 10^{18}$ | $8.0 \times 10^{15}$ | $1.4 \times 10^{18}$ | — | $4 \times 10^4$ | <10 | IE |
| 11H | | $5.0 \times 10^{18}$ | $8.0 \times 10^{15}$ | $1.4 \times 10^{18}$ | A | $4 \times 10^6$ | <10 | IE |
| 12H | | $5.0 \times 10^{18}$ | $8.0 \times 10^{15}$ | $1.4 \times 10^{18}$ | B | $5 \times 10^6$ | <10 | IE |
| 13H | Tail portion | $1.0 \times 10^{19}$ | — | $1.3 \times 10^{18}$ | — | $3 \times 10^4$ | >100 | CE |
| 14H | | $1.0 \times 10^{19}$ | — | $1.3 \times 10^{18}$ | A | $2 \times 10^6$ | >100 | CE |
| 15H | | $1.0 \times 10^{19}$ | — | $1.3 \times 10^{18}$ | B | $4 \times 10^6$ | >100 | CE |
| 16H | | $1.0 \times 10^{19}$ | $3.0 \times 10^{16}$ | $1.3 \times 10^{18}$ | — | $1 \times 10^5$ | <10 | IE |
| 17H | | $1.0 \times 10^{19}$ | $3.0 \times 10^{16}$ | $1.3 \times 10^{18}$ | A | $3 \times 10^6$ | <10 | IE |
| 18H | | $1.0 \times 10^{19}$ | $3.0 \times 10^{16}$ | $1.3 \times 10^{18}$ | B | $5 \times 10^6$ | <10 | IE |

As can be seen from Table 1, the high-level gettering ability can be exhibited in the test samples of the present invention in which the carbon is doped in the pulling process of the CZ method. That is, the BMD density of not lower than $1 \times 10^4$/cm$^2$ can be secured by performing the pre-epitaxial process heat treatment in either case where the test samples are sliced from the top portion of the single crystal (Test Nos. 5L and 6L) or the case where the test samples are sliced from the body portion (Test Nos. 11L and 12L), while the BMD density of not lower than $1 \times 10^4$/cm$^2$ can be secured in the test samples sliced from the tail portion (Test Nos. 16L to 18L) irrespective of the presence or absence of the pre-epitaxial process heat treatment.

As can be seen from Table 2, the high-level gettering ability can be exhibited in the test samples of the present invention in which the high-concentration oxygen is doped. That is, the BMD density of not lower than $1 \times 10^4$/cm$^2$ can be secured in any test samples sliced from the top portion of the single crystal (Test Nos. 4H to 6H), sliced from the body portion (Test Nos. 10H to 12H), or sliced from the tail portion (Test Nos. 16H to 18H1) irrespective of the presence or absence of the pre-epitaxial process heat treatment.

For all the test samples by the present invention, because the EP defect density is lower than ten per substrate (wf), it is found that the EP defect is remarkably decreased. It was confirmed that the observed defect was not the epitaxial defect attributable to the substrate crystal defect.

On the contrary, the EP defect density is not lower than 50 or 100 per substrate (wf) and almost all the observed EP defects are the epitaxial defects attributable to the substrate crystal defects in any of Comparative Examples (Test Nos. 1H to 3H) sliced from the top portion, Comparative Examples (Test Nos. 7H to 9H) sliced from the body portion, and Comparative Examples (Test Nos. 13L to 15L and 13H to 15H) sliced from the tail portion.

Example 2

The silicon single crystal whose straight body portion has a diameter of 300 mm was grown from a silicon raw material melt in which the high-concentration boron, carbon, and nitrogen are doped by the CZ method, and the wafers were sliced from three sections composed of the top portion, the body portion (intermediate portion), and the tail portion of the single crystal to produce test samples. At this point, the oxygen concentration of the test sample was separated into a low-concentration level and a high-concentration level.

As with the Example 1, the obtained test samples were separated into one group where the mirror polish finishing was treated to immediately perform the epitaxial growth process to the test sample and the other group where the epitaxial growth process is performed after the pre-epitaxial process heat treatment is performed, followed by the mirror polish finishing, and the heat treatment was set at two conditions A and B. In this case, the epitaxial process conditions, the measuring conditions of the doping amounts, BMD density, and epitaxial defect density, and the epitaxial defect evaluation conditions were similar to those of Example 1.

Tables 3 and 4 show the measurement results of the boron concentration, carbon concentration, oxygen concentration, BMD density, and epitaxial defect (EP defect) density along with the pre-epitaxial process heat treatment condition. Table 3 shows the low oxygen concentration level and Table 4 shows the high oxygen concentration level.

TABLE 3

| Test No. | Single crystal section | SIMS analytical result (atoms/cm$^3$) Boron | Carbon | Oxygen | Heat treatment | BMD (count/cm$^2$) | EP defect (count/wf) | Category |
|---|---|---|---|---|---|---|---|---|
| 19L | Top portion | $3.0 \times 10^{18}$ | — | $1.4 \times 10^{18}$ | — | $<1 \times 10^4$ | <10 | Comparative Example (CE) |
| 20L | | $3.0 \times 10^{18}$ | — | $1.4 \times 10^{18}$ | A | $2 \times 10^5$ | <10 | CE |
| 21L | | $3.0 \times 10^{18}$ | — | $1.4 \times 10^{18}$ | B | $5 \times 10^5$ | <10 | CE |
| 22L | | $3.0 \times 10^{18}$ | $2.0 \times 10^{15}$ | $1.4 \times 10^{18}$ | — | $3 \times 10^4$ | <10 | Inventive Example (IE) |
| 23L | | $3.0 \times 10^{18}$ | $2.0 \times 10^{15}$ | $1.4 \times 10^{18}$ | A | $3 \times 10^6$ | <10 | IE |
| 24L | | $3.0 \times 10^{18}$ | $2.0 \times 10^{15}$ | $1.4 \times 10^{18}$ | B | $4 \times 10^6$ | <10 | IE |
| 25L | Body portion | $5.0 \times 10^{18}$ | — | $1.2 \times 10^{18}$ | — | $<1 \times 10^4$ | <10 | CE |
| 26L | | $5.0 \times 10^{18}$ | — | $1.2 \times 10^{18}$ | A | $3 \times 10^5$ | <10 | CE |
| 27L | | $5.0 \times 10^{18}$ | — | $1.2 \times 10^{18}$ | B | $7 \times 10^5$ | <10 | CE |
| 28L | | $5.0 \times 10^{18}$ | $8.0 \times 10^{15}$ | $1.2 \times 10^{18}$ | — | $7 \times 10^4$ | <10 | IE |
| 29L | | $5.0 \times 10^{18}$ | $8.0 \times 10^{15}$ | $1.2 \times 10^{18}$ | A | $3 \times 10^6$ | <10 | IE |
| 30L | | $5.0 \times 10^{18}$ | $8.0 \times 10^{15}$ | $1.2 \times 10^{18}$ | B | $4 \times 10^6$ | <10 | IE |
| 31L | Tail portion | $1.0 \times 10^{19}$ | — | $9.0 \times 10^{17}$ | — | $<1 \times 10^4$ | >500 | CE |
| 32L | | $1.0 \times 10^{19}$ | — | $9.0 \times 10^{17}$ | A | $3 \times 10^5$ | >1000 | CE |
| 33L | | $1.0 \times 10^{19}$ | — | $9.0 \times 10^{17}$ | B | $5 \times 10^5$ | >1000 | CE |
| 34L | | $1.0 \times 10^{19}$ | $3.0 \times 10^{16}$ | $9.0 \times 10^{17}$ | — | $1 \times 10^5$ | <10 | IE |
| 35L | | $1.0 \times 10^{19}$ | $3.0 \times 10^{16}$ | $9.0 \times 10^{17}$ | A | $2 \times 10^6$ | <10 | IE |
| 36L | | $1.0 \times 10^{19}$ | $3.0 \times 10^{16}$ | $9.0 \times 10^{17}$ | B | $3 \times 10^6$ | <10 | IE |

TABLE 4

| Test No. | Single crystal section | SIMS analytical result (atoms/cm$^3$) Boron | Carbon | Oxygen | Heat treatment | BMD (count/cm$^2$) | EP defect (count/wf) | Category |
|---|---|---|---|---|---|---|---|---|
| 19H | Top portion | $3.0 \times 10^{18}$ | — | $1.4 \times 10^{18}$ | — | $4 \times 10^4$ | >100 | Comparative Example (CE) |
| 20H | | $3.0 \times 10^{18}$ | — | $1.4 \times 10^{18}$ | A | $1 \times 10^6$ | >100 | CE |
| 21H | | $3.0 \times 10^{18}$ | — | $1.4 \times 10^{18}$ | B | $2 \times 10^6$ | >100 | CE |
| 22H | | $3.0 \times 10^{18}$ | $2.0 \times 10^{15}$ | $1.4 \times 10^{18}$ | — | $7 \times 10^4$ | <10 | Inventive Example (IE) |
| 23H | | $3.0 \times 10^{18}$ | $2.0 \times 10^{15}$ | $1.4 \times 10^{18}$ | A | $5 \times 10^6$ | <10 | IE |
| 24H | | $3.0 \times 10^{18}$ | $2.0 \times 10^{15}$ | $1.4 \times 10^{18}$ | B | $7 \times 10^6$ | <10 | IE |
| 25H | Body portion | $5.0 \times 10^{18}$ | — | $1.2 \times 10^{18}$ | — | $3 \times 10^4$ | >100 | CE |
| 26H | | $5.0 \times 10^{18}$ | — | $1.2 \times 10^{18}$ | A | $1 \times 10^6$ | >100 | CE |
| 27H | | $5.0 \times 10^{18}$ | — | $1.2 \times 10^{18}$ | B | $2 \times 10^6$ | >100 | CE |
| 28H | | $5.0 \times 10^{18}$ | $8.0 \times 10^{15}$ | $1.2 \times 10^{18}$ | — | $1 \times 10^5$ | <10 | IE |
| 29H | | $5.0 \times 10^{18}$ | $8.0 \times 10^{15}$ | $1.2 \times 10^{18}$ | A | $4 \times 10^6$ | <10 | IE |
| 30H | | $5.0 \times 10^{18}$ | $8.0 \times 10^{15}$ | $1.2 \times 10^{18}$ | B | $6 \times 10^6$ | <10 | IE |

TABLE 4-continued

| Test No. | Single crystal section | SIMS analytical result (atoms/cm³) Boron | Carbon | Oxygen | Heat treatment | Density measuring result BMD (count/cm²) | EP defect (count/wf) | Category |
|---|---|---|---|---|---|---|---|---|
| 31H | Tail portion | $1.0 \times 10^{19}$ | — | $9.0 \times 10^{17}$ | — | $3 \times 10^4$ | >1000 | CE |
| 32H | | $1.0 \times 10^{19}$ | — | $9.0 \times 10^{17}$ | A | $2 \times 10^6$ | >1000 | CE |
| 33H | | $1.0 \times 10^{19}$ | — | $9.0 \times 10^{17}$ | B | $4 \times 10^6$ | >1000 | CE |
| 34H | | $1.0 \times 10^{19}$ | $3.0 \times 10^{16}$ | $9.0 \times 10^{17}$ | — | $3 \times 10^5$ | <10 | IE |
| 35H | | $1.0 \times 10^{19}$ | $3.0 \times 10^{16}$ | $9.0 \times 10^{17}$ | A | $7 \times 10^6$ | <10 | IE |
| 36H | | $1.0 \times 10^{19}$ | $3.0 \times 10^{16}$ | $9.0 \times 10^{17}$ | B | $1 \times 10^7$ | <10 | IE |

As can be seen from Tables 3 and 4, in the test samples by the present invention in which the carbon and the nitrogen are doped, the BMD density of not lower than $1 \times 10^4/\text{cm}^2$ can be secured in any test samples sliced from the top portion of the single crystal (Test Nos. 22L to 24L and 22H to 24H), sliced from the body portion (Test Nos. 28L to 30L and 28H to 30H), or sliced from the tail portion (Test Nos. 34L to 36L and 34H to 36H) irrespective of the presence or absence of the pre-epitaxial process heat treatment.

And for all the test samples by the present invention, because the EP defect density is lower than ten per substrate (wf), it is found that the epitaxial defects attributable to the substrate crystal defects are not generated.

In contrast, the EP defect density is not lower than 100, 500, or 1000 per substrate (wf) respectively in Comparative Examples (Test Nos. 19H to 21H) sliced from the top portion, Comparative Examples (Test Nos. 25H to 27H) sliced from the body portion, or Comparative Examples (Test Nos. 31L to 33L and 31H to 33H) sliced from the tail portion, and almost all the observed EP defects are the epitaxial defects attributable to the substrate crystal defects.

As described above, according to the silicon semiconductor substrate and the production method thereof by the present invention, in any epitaxial wafer substrate, the uniform and high-level gettering ability is obtained irrespective of the slicing positions from the silicon single crystal while the generation of the epitaxial defect can be suppressed, by doping carbon or carbon along with nitrogen during the pulling process of the CZ method or alternatively by performing the appropriate heat treatment prior to the epitaxial process. Therefore, the permissible upper limit (concentration margin) which is restricted by the formation of the ring-shaped OSF region can be much higher to exhibit the excellent gettering ability, and the epitaxial wafer in which the epitaxial defect attributable to the substrate crystal defect is not generated can be produced to thereby improve the crystal production yield remarkably, and thus the silicon semiconductor substrate by the present invention can widely be used as the silicon semiconductor substrate which becomes the epitaxial wafer.

What is claimed is:

1. A method for producing an epitaxial wafer wherein the epitaxial wafer includes an epitaxial film on a silicon wafer and a defect density to be found on the surface of the epitaxial wafer is not higher than 10 counts per substrate (wf), the silicon wafer being sliced from a silicon single crystal, the silicon single crystal being grown while boron ranging from $1 \times 10^{17}$ to $1 \times 10^{19}$ atoms/cm³ and carbon ranging from $1 \times 10^{15}$ to $2 \times 10^{16}$ atoms/cm³ (ASTM F123-1981) are doped on a condition that a ring-shaped oxygen induced stacking fault region emerges in a crystal surface over a whole length of a straight body portion of a pulled silicon single crystal by the Czochralski method.

2. A method for producing an epitaxial wafer wherein the epitaxial wafer includes an epitaxial film on a silicon wafer and a defect density to be found on the surface of the epitaxial wafer is not higher than 10 counts per substrate (wf), the silicon wafer being sliced from a silicon single crystal, the silicon single crystal being grown while boron ranging from $1 \times 10^{17}$ to $1 \times 10^{19}$ atoms/cm³, carbon ranging from $1 \times 10^{15}$ to $2 \times 10^{16}$ atoms/cm³, and nitrogen ranging from $5 \times 10^{12}$ to $5 \times 10^{14}$ atoms/cm³ (ASTM F123-1981) are doped on a condition that a ring-shaped oxygen induced stacking fault region emerges in a crystal surface over a whole length of a straight body portion of a pulled silicon single crystal by the Czochralski method.

3. The method for producing an epitaxial wafer according to claim 1, wherein heat treatment is performed to the silicon substrate, sliced from said silicon single crystal, at 700° C. to 900° C. for 15 minutes to 4 hours prior to an epitaxial process.

4. The method for producing an epitaxial wafer according to claim 2, wherein heat treatment is performed to the silicon substrate, sliced from said silicon single crystal, at 700° C. to 900° C. for 15 minutes to 4 hours prior to an epitaxial process.

5. The method for producing an epitaxial wafer according to claim 1, wherein the silicon substrate is sliced from the silicon single crystal which is grown while an oxygen concentration ranges from $9 \times 10^{17}$ to $16 \times 10^{17}$ atoms/cm³ (ASTM F121-1979).

6. The method for producing an epitaxial wafer according to claim 2, wherein the silicon substrate is sliced from the silicon single crystal which is grown while an oxygen concentration ranges from $9 \times 10^{17}$ to $16 \times 10^{17}$ atoms/cm³ (ASTM F121-1979).

7. The method for producing an epitaxial wafer according to claim 1, wherein a BMD density in a cross section of a silicon substrate sliced from said silicon single crystal is not lower than $1 \times 10^4$ count/cm² in any region over the whole length of the straight body portion of the single crystal.

8. The method for producing an epitaxial wafer according to claim 2, wherein a BMD density in a cross section of a silicon substrate sliced from said silicon single crystal is not lower than $1 \times 10^4$ count/cm² in any region over the whole length of the straight body portion of the single crystal.

9. A method for producing an epitaxial wafer, wherein an epitaxial defect attributable to a crystal defect of a silicon semiconductor substrate does not exist in a surface of an epitaxial layer in any region over the whole length of the straight body portion of the single crystal when said epitaxial layer is formed on the silicon wafer obtained by the production method according to claim 1.

10. A method for producing an epitaxial wafer attributable to a crystal defect of a silicon semiconductor substrate does not exist in a surface of an epitaxial layer in any region over the whole length of the straight body portion of the single crystal when said epitaxial layer is formed on the silicon wafer obtained by the production method according to claim 2.

* * * * *